United States Patent [19]

Huth

[11] Patent Number: 5,689,603
[45] Date of Patent: Nov. 18, 1997

[54] OPTICALLY INTERACTIVE NANOSTRUCTURE

[76] Inventor: Gerald C. Huth, 4701 Grand Ave., Ojai, Calif. 98028

[21] Appl. No.: 88,051

[22] Filed: Jul. 7, 1993

[51] Int. Cl.⁶ .................................................. G02B 6/10
[52] U.S. Cl. .......................... 385/131; 257/17; 257/21; 257/94; 257/465; 372/43
[58] Field of Search ........................ 385/129–131; 372/43–47, 50; 257/14, 15, 17, 21, 22, 80, 84, 85, 94, 464, 465

[56] References Cited

U.S. PATENT DOCUMENTS

| | | | |
|---|---|---|---|
| 5,079,601 | 1/1992 | Esaki et al. | 257/22 |
| 5,138,625 | 8/1992 | Paoli et al. | 372/46 |
| 5,332,910 | 7/1994 | Haraguchi et al. | 257/465 X |
| 5,339,370 | 8/1994 | Sano et al. | 385/131 X |
| 5,348,618 | 9/1994 | Canham et al. | 156/644.1 |
| 5,416,338 | 5/1995 | Suzuki et al. | 257/21 |

*Primary Examiner*—John D. Lee
*Attorney, Agent, or Firm*—Choate, Hall & Stewart

[57] ABSTRACT

Optically interactive nanostructural element. The element includes a semiconductor substrate including at least one radiation guide region extending into the substrate. The geometry of the substrate material surrounding the radiation guide region is selected so that it acts as a quantum confinement region for electrons in the substrate material and the radiation guide region acts as a classical waveguide for radiation so that the element absorbs or emits light of a wavelength corresponding to the selected geometry. In a preferred embodiment, the optically interactive nanostructural element includes an array of the radiation guide regions spatially disposed over a surface.

17 Claims, 3 Drawing Sheets

5,689,603

OPTICALLY INTERACTIVE NANOSTRUCTURE

BACKGROUND OF THE INVENTION

Methods currently used in selection of a semiconducting material for a specific optical application generally rely on the approach based on quantum physics of selecting a semiconductor material with the appropriate energy bandgap. An example of this approach might be the exercise of selecting an optimum semiconductor from which to form a solar photovoltaic cell. It is found that either silicon, cadmium telluride, or gallium arsenide are the most appropriate candidates because their energy bandgaps most closely match the spectrum of the sun at sea level. In a second example, if a specific wavelength in the visible range of light emission is desired for a light emitting semiconductor diode or laser device, materials such as the complex semiconductor compounds of gallium aluminum arsenide are employed because by varying composition of the various components the energy bandgap can be tailored to match the desired light emission characteristic (generally from red to green). Blue emission has proven very difficult to achieve and the difficult to fabricate semiconductor material silicon carbide must generally be used to emit this short wavelength.

In other optical applications where, for example, it is desired to spatially encode positional wavelength (color) information, as on photographic film to form a color image, chemical "pigments" are used in conjunction with the age old technology of silver halide grain development to form an image that has approximately micrometer ($10^{-6}$ meter) spatial resolution. In some cases only the positional aspect of an optical interaction is used as in black and white photographic film or in optical disk information storage technology. In the latter the information is digitally encoded in minimum sized "dots" corresponding to the optical wavelength—again generally in the one micrometer size range.

In general, then, the desired optical absorption or emission characteristics of a material are considered to be determined either by quantum physics energy bandgap or traditional, chemically based, optical pigment considerations.

Two previous patent disclosures first entered the realm of invoking spatial dimensional considerations as being effective in absorbing electromagnetic radiation of optical wavelengths. Both inventions go further in applying this insight introducing specific nanodimensional structures for solar power conversion. The term "nanodimensional" is defined as being in the range of lengths, etc. from one nanometer (or $10^{-9}$ meters) to one micrometer (or $10^{-6}$ meters).

Marks in U.S. Pat. No. 4,445,050 discloses a new type of spatial device for the absorption of optical wavelength solar radiation in the form of a dipole "antenna" of finite and specified nanometer length. These antennae are subsequently formed in that disclosure into an array structure and coupled with electrical rectification devices in nearby (but remote from the viewpoint of this invention) locations to perform subsequent radiant energy power conversion. In Marks' concept, therefore, absorbed light energy is assumed to generate in some unspecified manner a thermalized electron somewhere near or at the dipole antenna absorption site and usual thermalized conductive electron behavior is expected to follow from this point.

Fletcher and Bailey in U.S. Pat. No. 3,070,257 disclose another spatial optical absorption concept that utilizes the space between two adjacent "receptors" or perturbances formed from either conductive or dielectric materials as the region of spatial extent wherein light or other forms of electromagnetic energy are absorbed. This energy is assumed to be "trapped" between the two receptors resulting in a voltage difference being generated between them. This voltage difference is subsequently sensed in an electrical rectification circuit formed in a specific circuit disclosed between the adjacent receptors with the invention again being directed toward solar power conversion application. This disclosure is vague on the subject of dimensions required other than to state that they must be of "less than the wavelength of light".

Thus both Marks and Fletcher & Bailey both describe physically extended structures generally having nanometer spatial dimensions that they propose as being effective for absorbing light or other electromagnetic radiation. Regarding specific, quantified, design rules, Marks in his disclosure gives an optical wavelength-specific formula for calculating the length of his dipole antenna; such being as $\lambda/2n$ where $\lambda$ is the optical wavelength of interest and n is the index of refraction of the material used to form the antenna, with the antenna width given as about 10 nanometers and with the dipoles of the array repeating at every $\lambda/kn$ interval of space. Fletcher & Bailey go beyond a specified "length" and indicate that a still rather generalized "aspect ratio" is desirable for operation of their invention. In their receptor array design, receptor height is given as several, and up to seventy five, wavelengths of the longest wavelength of incident radiation of interest, and the centerline spacing between adjacent receptors is given as on the order of, or less than, the wavelength of interest.

Both Marks and Fletcher & Bailey are vague on the point of exactly where the transition from photon (Marks) or classical wave light energy (Fletcher & Bailey) to thermalized electron conversion takes place in the device structures that they propose in essence simply assuming that this transition does somewhere occur.

More recently a totally new phenomenon in regard to light interaction with matter has been discovered by Canham (App. Physic. Lett., Vol 57, (10) 3 Sep. 1990) in the discovery of very unexpected and intense visible light emission from silicon semiconductor surfaces that have been anodically etched in hydrofluoric acid mixtures (an acid that does not overtly etch silicon single crystal). This development has generated intense interest in the scientific community and has now been generally termed "porous silicon" a term that indicates the character of the etched silicon surface. This development is surprising in that the extremely well characterized indirect energy bandgap of silicon did not predict this behavior. The morphology of these etched light emitting surfaces generally shows a field of irregularly shaped silicon "pillars" and intervening hollow "pores" the composite forming an exceptionally high aspect ratio structure. Specification of the emitted wavelength from these etched silicon surfaces is not yet possible with the exception that it has been experimentally found that "increased etching time generally shifts the emitted radiation to shorter ("blue shifted") wavelengths." Progression of colors in most experiments has been from a red-orange to greenish. There is currently an ongoing debate in the scientific community as to the mechanism involved in this new light conversion process. It is, however, now becoming increasingly accepted that a quantum mechanism (either "wire" or "dot" structures are proposed) is involved, i.e., the sizes of the "pillar" structures must be reduced generally to quantum dimensions before visible light is emitted.

In a further development following from Canham's original porous silicon anodic etching process, Doan and Sailor (Science, Vol. 256, 26 Jun. 1992) have used the well known fact that the speed of semiconductor etching can be enhanced when light is directed onto the semiconductor surface during the etching process. These investigators used a black and white photographic negative to imprint a two dimensional luminescent image (a "porous silicon image") onto a silicon surface. It is important to note that the image that they observed which displayed some coloration represented simply regions of differential contrast with the colors observed being "false" optical interference coloration (as observed, for example, from thin oil films on water surfaces).

Additional experimental evidence has been elicited in recent years that visible light effects are involved in semiconductor integrated circuitry devices and structures as these are fabricated with increasingly small dimensions—now well into the nanospatial domain. One such report by Koch et al (Physics & Technology of Submicron Structures, Springer-Verlag, p. 253) shows visible light emission from MOS-FET semiconductor device structures attributed to degradation under electrical stress of micron-sized device features into sub-micron light emitting structures.

SUMMARY OF THE INVENTION

The present invention overcomes the imprecision and unworkability of previous spatially related concepts in that it for the first time recognizes that light must be directed to interact with quantum confined electrons to effect the most fundamentally defined process of the interaction of optical radiation with matter—the coalescence of a photon with an electron in an interaction in space (it will be recognized, and is a part of this invention, that the converse of this—an electron-to-photon interaction resulting in light emission is also true). A basic optically interactive nanostructure is disclosed that through choice of physical dimensions and materials used to fabricate it can be designed to encode for specific optical wavelengths (colors). Moreover, this nanostructure possesses this capability for such nanoscale color coding in the three dimensions. In the nanostructure of this invention light is considered to be directed using sub-optical wavelength wave optics principles to specific sites in immediately adjacent structural matter that contain quantum confined electrons to complete the detection process. The exact design rules for fabricating this basic building block structure form the basis for this invention. The invention, however, further teaches that it is possible to array these wavelength tunable basic structures over extended two dimensional surfaces to produce an optically interactive surface that can be designed to match any incident optical spectral shape that it is desired to detect (or again, conversely, emit).

The nanostructure of this invention in itself can be integrated into semiconductor device structural design to perform either light-to-light, electron-to-light, or light-to-electron conversion functions. In the first instance, the nanostructure can encode, in nanoscale dimensions using a unique etching process disclosed in this invention, color images or other information formats. When the nanostructures of this invention are designed and fabricated for monochromatic wavelength emission intense primary colors can be caused to be emitted from large area surfaces. In the electron-to-light conversion application the structure may be placed, for example, adjacent to a forward biased semiconductor PN junction from which electrons can be injected into the structure either by diffusion or by field assisted carrier transport to cause visible light emission thus forming light emitting devices that will emit light at any designed wavelength. Again, with the limitation of intensity in mind, such devices can be made uniquely small. In light-to-electron application, an array of these structures, for example, can be configured to match the solar spectrum over extended areas and may be placed immediately adjacent to, or in, the built-in space charge region of a semiconductor PN junction to effect the desired conversion. This general type of device structure will also make an entirely new class of unique photodetection devices possible.

In applications other than devices, the basic light interactive nanostructure of this invention may be used, for example, to encode color information onto the heretofore only position specific, optical wavelength dimension, physical dots or depressions used to encode information in optical data storage for audio and computer use. The use of additional color information encoding here will vastly increase this information storage capability of this medium.

DESCRIPTION OF THE PREFERRED EMBODIMENT

Figure 1:
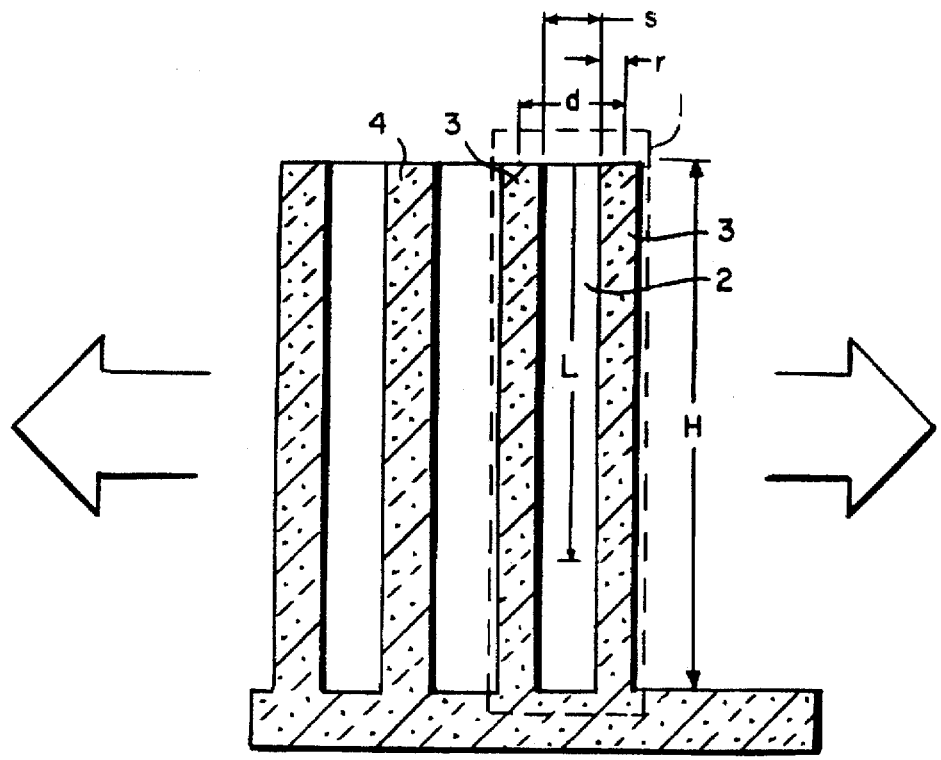
FIG. 1 is a schematic illustration of the lateral cross section of the basic optically interactive nanostructural unit.

As shown schematically from FIG. 1, the basic "building block" optically interactive nanostructure of the present invention is outlined in region 1 and comprises a central optical lightguide region region 2 fabricated, for example, as a cavity on the surface of a semiconductor, which is intimately and directly bounded by surrounding receptor region or regions 3. The surrounding region 3 can be either of a discrete shaped free standing "pillar" or alternatively formed as a thin "web" separating adjacent cavities but it must always be of sufficiently narrow dimension to act as a quantum confinement region for electrons in the specific material used. This is a readily calculable dimension for semiconductor materials. The central optical lightguide region 2 of the nanostructure acts as an optical waveguide for visible radiation impinging on the structure operating on principles that apply when the elements of such structures have diameters and/or separation distances that are smaller than the wavelength of light. Region 2 can therefore contain either air or specific solid materials that posses refractive index values defined by the principles disclosed in this disclosure. With the dimension of the electron quantum confinement region fixed by the material chosen, the dimensions of the cavity lightguide are chosen to absorb light of a desired wavelength or band of wavelengths as will be described below. The central optical lightguide region then directs photons into specific regions of space within the nanostructure where they will coalesce with quantum confined electrons in the receptor 3 portion of the structure. Thus, as explained below, the basic optically interactive nanostructure can be precisely optically tuned to absorb or emit a particularly chosen narrow or defined band of radiation. The basic wavelength tunable building block structure can be replicated or arrayed laterally as depicted as region 4 in FIG. 1 to form large scale optical devices formed from these nanostructural elements.

Figure 2A:
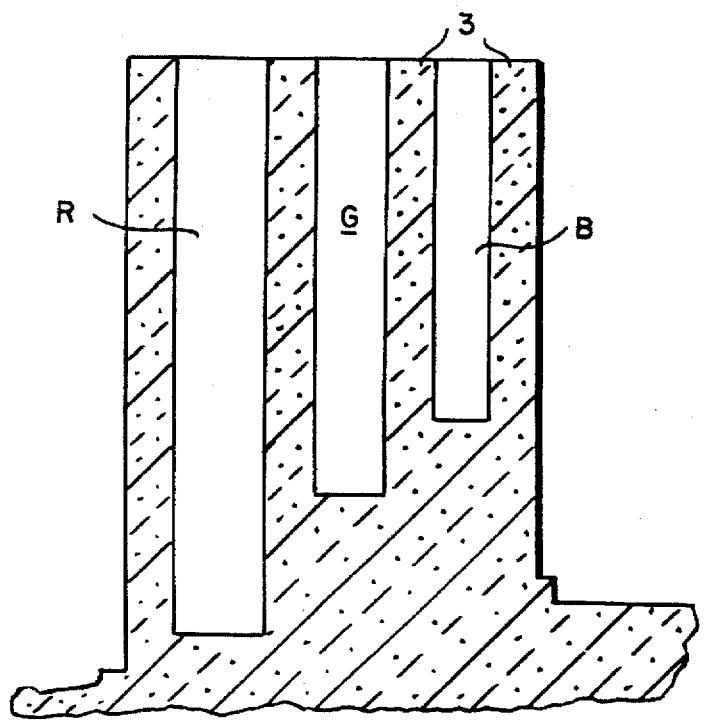
FIG. 2a is a schematic illustration of the manner in which geometrical means can be used in shaping the vertical dimension and arraying the electron quantum confinement receptors of the basic nanostructural unit to broad band the optical wavelength response within each unit and to array units to effect optical response at differing wavelengths over extended areas.

FIG. 2a shows how the basic optically interactive nanostructure may be arrayed over a surface as shown schematically with the wavelength response and thus geometry of each device being independently specified. Therefore, as shown in FIG. 2a, basic nanostructures can be configured to respond, for example, to the primary red (R), green (G), and blue (B), colors and such elements can be arrayed side by side in any two dimensional geometrical configuration.

Figure 2B:
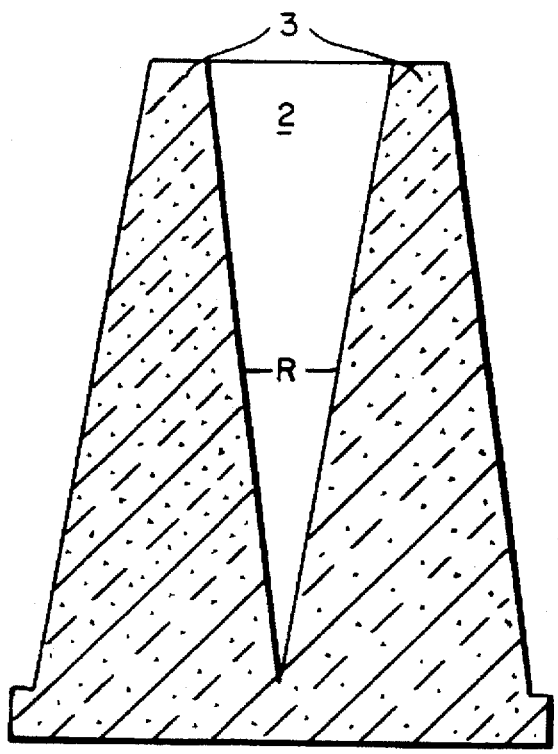
FIG. 2b is a schematic illustration of a second method for achieving broad banded optical response by altering the shape as viewed from above of the electron quantum confinement receptors.
Figure 2C:
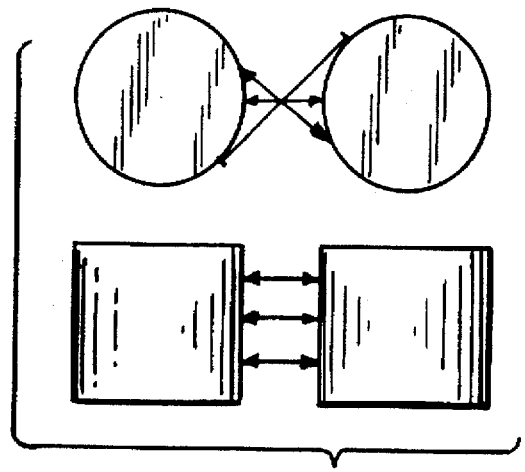
FIG. 2c is a plan view of suitable radiation guide regions.

Additionally as shown in the lateral view of FIG. 2b, the electron quantum confinement receptors 3 themselves can be geometrically shaped in their vertical or height dimension (to form the "cone" shape indicated, for example) which will have the effect of "broad banding" of the optical response. This implies that from a geometrical viewpoint there are actually many alternative lengths rather than one discrete separation distance between receptors. Alternatively, and using the same effect, as shown in FIG. 2c the orthogonally viewed (from above) shape of each receptor can also be used to achieve geometrical optical broad banding. Circularly shaped receptors are shown but other shapes can be used as well to achieve different effects. In each case, however, electron quantum confinement conditions must be maintained in receptor design. This may lead, for example, to the use of "corrugated" vertical receptor shapes as shown in FIG. 2c wherein the optical separation distance can be varied while maintaining the central electron quantum confinement dimension of the receptor.

Following from the fundamental principle of this invention that nanoscale spatial geometry reflects the characteristics of the optical wavelength absorbed or emitted by the structure, it is necessary to define the dimensional parameters of the nanostructure. As shown in FIG. 1, d is the center-to-center distance between adjacent electron quantum confinement regions 3, r is the radius of a single electron quantum confinement region, the parameter s (or {d−2r}) is the diameter of the central optical lightguide region 2, H is the maximum depth of the central optical lightguide region 2 corresponding to the wavelength-specific design point for the nanostructure determined using the following equations, and L is the depth calculated using the same equations for other shorter wavelengths that can be extracted at shallower depths of the region. These represent the depths at which photons of the designed wavelength coalesce with quantum confined electrons in the most fundamental definition of optical detection. The parameters $\eta_1$ and $\eta_2$ are the optical refractive indices of the substrate material used to form the nanostructure (receptors 3) and the optical lightguide 2 respectively.

Referring to FIG. 1, considering the operation of the optically interactive nanostructure of this invention in more detail, light incident upon such a nanostructure enters the lightguide region 2 and travels a distance L down the length of the region before coalescing with a quantum confined electron in an adjacent quantum confinement region 3 at a depth L. Determination of the coupling coefficient between neighboring quantum confinement regions is based on an analysis of radiation power transfer between optical fibers by McIntyre and Synder *Journal of the Optical Soc. of America*, Vol. 63, No. 12, 1973 and is related to the geometry of the basic optically interactive nanostructure. The equation describing the geometry of this optically interactive nanostructure has been approximated by the inventors as:

$$\log L/r = 2.88\ \delta^{-2}\ (s/\lambda) + 0.42\ \delta^{-2}\ (r/\lambda) - 0.3\ (s/r) - \log \delta \quad (1)$$

where $\delta = 1 - (\eta_1/\eta_2)^2$.

If the value $\eta_1$ is much smaller than $\eta_2$ which corresponds generally to the most applicable silicon/air geometry of the nanostructure, then the value $\delta$ approaches 1 allowing further simplification to:

$$\log L/r = 2.88\ (s/\lambda) + 0.42(r/\lambda) - 0.3\ (s/r) + 1 \quad (2)$$

This equation contains three parameters relating to the dimensionality of the nanostructure with the additional light dependent parameter $\lambda$. Further, the lateral dimension of the electron quantum confinement region (radius r) is extremely narrow and this region becomes relatively insensitive to optical absorption effects. Assuming r to be of such a narrow, and in this case of fixed, distance determined by choice of substrate material, the above equation can be simplified even further to become:

$$\log L = s\ (2.88/\lambda - 0.3/r) + 0.42\ (r/\lambda) + \log r + 1 \quad (3)$$

or more simply:

$$\log L = A(s+B) \quad (4)$$

where $A = 2.88/\lambda - 0.3/r$ and $B = 0.42\ (r/\lambda) + \log r + 1$ where A and B are numbers that can be calculated once r and $\lambda$ are given. The separation between adjacent electron quantum confinement regions can be varied and the corresponding value L calculated. Alternatively, the wavelength $\lambda$ and new values of A and B result and the new relationship between s and L calculated. This is amenable to graphical presentation for all values. More generally, the depth L and the lateral width of the radiation guide region which determine the aspect ratio of an optical lightguide region is determined by $$\log_{10}(2L/\pi r) = (-0.46 \times V + 0.3) \times d/r + 0.85\ V - 1.4 + \log \delta$$

where r is the radius of the quantum electron confining receptor encompassing the optical lightguide region, $\delta = 1 - (n_1/n_2)^2$ where $n_1$ is the refractive index of the substrate material and $n_2$ is the refractive index of the optical lightguide region, the quantity d−2r is $V = 2\pi r \delta/\lambda$ where $\lambda$ is the light wavelength.

From the equations, it is seen that for a given nanostructure geometry, a spectrum of wavelengths absorbed into the lightguide cavity are each absorbed at a different point along the vertical height of the region. A shorter wavelength corresponding to higher frequency, e.g., blue light, is absorbed at deeper depths, while longer a wavelength travels less deeply into the lightguide space and thus interacts with quantum confined electrons at shallower depths along the receptor. Therefore, by selecting an optical wavelength λ for which it is desired to tune the nanostructure to, and by fixing r to calculable, quantum confined electron dimensions for the substrate material chosen (roughly 10 nanometers for silicon) it is possible using the above relationships to calculate the width (d–2r) and height H or L for the lightguide cavity region.

Using the above equation for configuring an optically interactive nanostructure formed on a silicon substrate, for red light of wavelength 640 nanometers the optical lightguide region would take dimensions s(or "d–2r") of 131 nanometers and H of 855 nanometers. For mid-band green light of 480 nanometers dimensions would be an s of 98 nanometers and H of 642 nanometers. For blue light of wavelength 400 nanometers dimensions would correspond to a lightguide lateral width s of 82 nanometers and depth H of 535 nanometers. Thus it is possible to differentiate nanostructures sensitive to the primary colors of the visible spectrum. That is, the equations above may be used to determine concisely, for each wavelength of interest, the corresponding coalescence depth L for a given nanostructural element geometry.

Additionally, based on the relationships given by this invention, shorter optical wavelengths corresponding to deeper photon-electron coalescence depths L into the overall nanostructure may be selected and this vertical selectivity of the nanostructure presents the capability for extracting these optical "sub-signals" at specific lengths along the vertical dimension of the electron quantum confinement region that bounds the central optical lightguide region. As shown schematically in FIG. 3 placement of signal extraction means indicated by L $\lambda_{1-3}$ at spaced-apart points along the depth of the structure provides a means for connecting the local quantum environment to some external circuitry (not shown) for sensing the photon-electron coalescence occurring at each of the corresponding coalescence points along the depth. This may prove useful in selecting even only two optical bands that would be detectable at different (but calculable) depths. Certain fish retina are purported to possess this capability. In a larger sense, this elegant and unique three dimensional color sensing may be used, for example, in an extended nanoarchitecture designed to form an optical imaging plane that has the unique ability to be free simultaneously from both orthogonal (longitudinal and lateral) forms of chromatic aberration. This cannot be accomplished with any traditional optical lens device.

Figure 3:
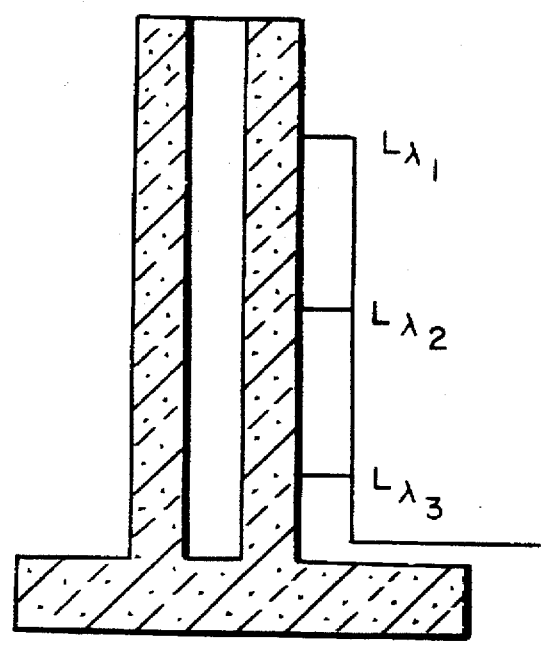
FIG. 3 is a schematic illustration of the extraction of wavelength specific signals from the vertical dimension of the electron quantum confinement receptors.

It will always be true, and is disclosed as a fundamental aspect of this invention, that in a converse operation to the optical detection capabilities diagramed in, and discussed regarding, FIG. 3, emission of light can be achieved by reversing the process and providing electrical stimulation at appropriate distances along the vertical height of the quantum confinement region.

Figure 4A:
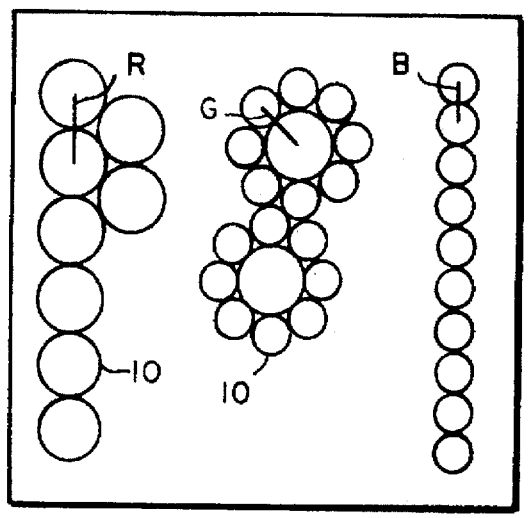
FIG. 4A shows diagrammatically how basic nanostructural units can be arrayed in two dimensions to achieve different purposes. This "rosette" array design achieves a narrow mid-band wavelength response at all angles of optical polarization.
Figure 4B:
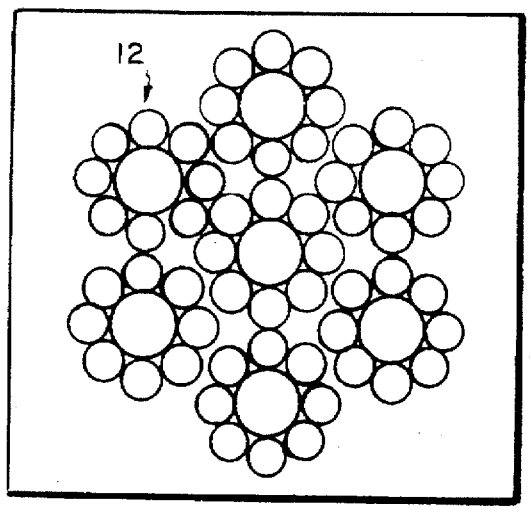
FIG. 4B shows diagrammatically an array structure of nanostructural units that performs the function of a "nanoscale optical diffractometer" with longer wavelength (red) response at the left.

The basic optically interactive nanostructure that forms the basis for this invention can be two dimensionally arrayed in extended "nanoarchitectures" as shown in FIGS. 4A and 4B to create optical surfaces, devices and systems that possess any desired spectral response. The diameter of the circles 10 shown in the figures represent the overall "lateral effective spatial extent" of the basic optical nanostructure, i.e., the extent of the central lightguide region and it's surrounding electron quantum confinement areas. Larger circles as indicated by R in FIG. 4A therefore, by the teaching of this invention, represent longer wavelength red response with smaller circles indicated by B corresponding to blue response. Appositions of large and small effective area nanostructures then provide the "mid-band" wavelength response indicated by G in FIG. 4A. It becomes obvious, and it is a fundamental teaching of this invention, that the ratio of the largest to the smallest size nanostructure determines the overall optical bandwidth of the array surface. For the optical bandwidth which extends from 400 to 700 nanometers this then corresponds to a size ratio of 1:1.75. This ratio, in turn, allows a maximum of 8–8½ small areas to be grouped around each large area as representing mid-band response. This corresponds, for example, to the mid-band "yellow spot" of the retina of the human eye.

Then, in the most general embodiment, a nanoarchitecture of basic elements can be designed to synthesize any spectral response function over a two dimensional area. The nanoarchitecture of FIG. 4a could be used, for example, to perform an optical "nanodiffractometry" function where wavelength response varies from red to blue from left to right across the surface. This diffractometric array structure also mimics the retina of the eye with this being, in concentric ring fashion, the arrangement of retinal receptors from the fovea extending outward to larger parametric angles around the retina.

In FIG. 4B, nanostructures 12 of the same size and therefore the same wavelength response are arrayed in circular "rosette" fashion again similar to that characteristic of the "yellow spot" on the retina of the eye. Additionally, this arrangement will accept light of all angles of optical polarization and will be "mid optical band" (green-yellow) sensitive being composed mainly of direct large circle-small circle appositions. It is obvious, and is taught by this invention, that other nanoarchitectures can be designed using the basic optically interactive nanostructure to accept light of only one or any number of different angles of polarization.

Also, in the spirit of this invention that nanogeometrical considerations determine optical wavelength response, geometric shaping of the individual electron confinement receptors of the nanostructure as shown in FIG. 2C may be used to broad band optical response and "fill in" intervening wavelength response intervals. As indicated, a round shape for such receptors must represent some degree of broad band response by virtue of differing lateral dimensions as indicated. A square shaped receptor would represent more monochromatic response.

In summary, any optical spectral response function can be matched and synthesized in array form.

It will be further obvious from the teaching of this invention that the basic optically interactive elements disclosed herein are of nanometer dimensions corresponding therefore to a potential for extremely high density information storage. All of the principles described in this disclosure including the three dimensional encoding of color and the broad number of optical functions that can be addressed using nanoarchitectures of the basic optically interactive nanostructure with reflect this information encoding or storage capability. It is also obvious that these concepts may be used to form a much more diverse and wider variety of patterns than described above. These may be of a graphic, artistic, alphanumeric or otherwise encoded nature whose purpose is generally to store information in the nanoscale.

Again and always, converse to all of the above spatial optical concepts and considerations that have been directed at an optical detection function, all of such structures, devices and systems may be configured to emit optical radiation if the nanostructural elements are placed in, or are made an inherent part of, a semiconductor device structure capable of injecting electrons into the quantum confined electron receptors of the nanostructure.

The optically interactive nanostructure of this invention may be produced with a variety of materials and using a broad range of conventional materials processing techniques. The following discussion of example techniques is meant to be descriptive, but in no way limiting as to production of the nanostructure.

There will be in summary two general classes of methods for fabricating the nanostructure of this invention. In the first case where specific nanometer scale positioning of the wavelength encoded basic nanostructures is required—as in arrays designed to perform specific optical functions or to store or encode information—the precise registration capabilities of nanolithographic technology will be required. Alternatively, as disclosed in this invention, methods capable of nanoregistry such an scanned ion or electron beams might be used in conjunction with the electrolytic etching process disclosed in this invention to positionally encode optically interactive nanostructures. This latter method may prove to be a much less expensive way to accomplish this function. In another class of applications where it is desired to create large area optical surfaces composed of arrays of the same or a broadly wavelength encoded basic nanostructures, and nanometer scale positioning is not required, relatively inexpensive surface etching methods may be used. The latter may be said to fail under the class of "materials processes".

It is expected that silicon will be used initially as the material of choice for forming these nanostructures because it exhibits excellent mechanical strength and thermal properties that are consistent with the requirements of forming relatively high aspect ratios to achieve the optical effects that are the basis for this invention. And too, current high resolution nanolithography has fundamentally been developed around this material. It will be understood by those skilled in the art that nanolithographic technology comprises such as either x-ray mask patterning or electron beam pattern writing techniques to define the optically interactive nanostructure and its deployment over extended area this being followed by appropriate etching techniques to etch and define the specified lightguide region.

Other semiconducting, dielectric, or conducting materials may also be employed to fabricate the optically interactive nanostructure of the invention using nanolithographic techniques as will be appreciated by those skilled in the art.

In a specific fabrication technique developed as part of this invention, single crystal silicon is again employed as the base substrate material in conjunction with the general electrolytic anodic etching process developed elsewhere to produce "porous" luminescent silicon. In the process disclosed here, however, the principles of this invention are used together with anodic etching to define and fabricate silicon surfaces with specified optical wavelength response.

Figure 5:
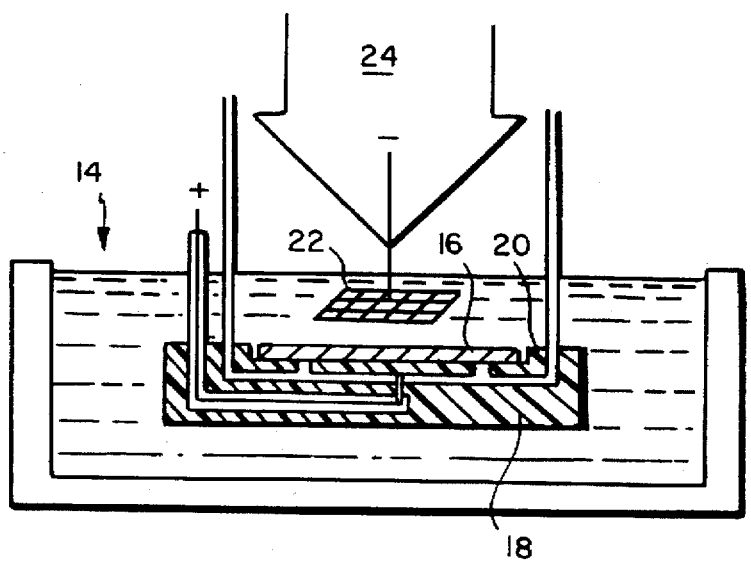
FIG. 5 shows a cross section of the electrolytic anodization cell used to fabricate the optically interactive nanostructures of this invention using intense light illumination simultaneous with the anodization process.

Referring now to FIG. 5, which shows diagrammatically the electrolytic bath 14 used to etch the nanostructured silicon surface 16, an acid resistant Teflon (registered Trademark) or equivalent fixture 18 is employed to immerse the silicon in the acid bath with the silicon wafer being held in place by vacuum and an "O" ring seal 20 as indicated. The back surface of the silicon wafer 16 is coated with a suitable metallic or other electrical conductor by vacuum deposition, sputtering, or other methods known in semiconductor processing technology. A cathode 22 is formed from platinum mesh or screen to allow light to penetrate through it. Optimum and well known electrolytic cell conditions as to cathode and anode areas, separation distance, are employed. Electrical connections are made as indicated to complete the usual electrical circuit. An innovation of this invention, and discussed below, is the requirement that light 24 of the wavelength chosen to optimize the optically interactive nanostructure is made incident onto the silicon wafer during the entire electrolytic etching process.

The overall objective in this silicon etching process development is to achieve surface nanostructures that embody the principles of the optically interactive nanostructures taught in this invention. In this case, this means that the average distance between high aspect ratio lightguide regions (the "pores" in the etching process) must be of electron quantum confinement dimensions. This would generally correspond in a hypothetical etched surface to the thickness of the "webbing" remaining between adjacent pores. Moreover, to achieve a specific optical wavelength response, it is taught in this invention that the dimensions of the lightguide pores must be of specified dimensions. If one thinks at this point that the lightguide pores must be somehow "nucleated" in the etching process, such "nucleation centers" must be appropriately spaced on the silicon surface to be etched.

It has been found in experimental development that lightguide pore density, and therefore optical wavelength response, correlates with the density of dopant atoms in the silicon single crystal material—in effect, that the site of energy localization provided by the lattice mismatch of the dopant atoms serve as the sites to nucleate etched pores. In achieving a short wavelength ("bluer") response, a higher density of lightguide pores will be desirable in conjunction with the etching requirement to reduce the space between lightguide pores to electron confinement dimensions.

Resistivities values for silicon found to be useful in producing shorter wavelength response could be as low as 0.004 ohm-cm (n-type). Crystal orientation preferred was <100>. It is obvious that the highest quality silicon single crystal with the lowest defect density and oxygen and carbon concentration will be preferred as substrate starting material since these factors can also conceptually initiate the lightguide pore nucleation process that it is necessary to control. In this regard, "float zone" low oxygen content silicon was used in developing the process disclosed in this invention.

It will be stressed here, however, that the above lightguide pore nucleation considerations are only effective if the subsequent anodic etching process can be optimized to produce the required high aspect ratio lightguide pore taught in this invention. The following process conditions are therefore preferred to reach the desired result of being able to specify the wavelength of optical response of the wafers.

It was found generally that very low cell current densities were optimum. Values in the range from 0.17–0.3 mA/cm$^2$ were used but other values may suffice. This step that results in a relatively slow etching process, allows the process to accommodate less rounding of edges of the silicon nanostructures and thus leads to the ability to produce the required deep and higher aspect ratio lightguide pores. Another measure to achieve this same result is use of "slower" hydrofluoric acid (HF) etching solutions. It is realized that this is a very imprecise term but the entire field of silicon etches and etching procedures is still replete with a great deal of empirical "witchcraft". In this development, 1:1 mixtures of hydrofluoric acid and ethanol ($CH_3OH$) were found to be useful.

Simultaneous with the electrolytic etching process, light of wavelength for which it is desired to tune the optically interactive nanostructure is made incident onto the silicon wafer in the etch bath solution. In a well known effect, this incident light application impresses a wavelength periodicity onto the lateral dimensions of the silicon surface that correspond to the wavelength of the incident light. At the limit using high intensity laser illumination, surface melting can occur and, with optimized resolidification, solid wavelength-associated periodic surface structures are observed. Lower intensities were used in development of this invention but it is obvious that any light intensity up to the point of surface melting may ultimately prove useful.

As an example, application of a relatively low intensity of green light, obtained by filtering an 80 watt tungsten lamp (a microscope illuminator) onto a 0.004 ohm-cm resistivity four inch diameter silicon wafer produced intense green photoluminescence after a three hour and fifty minutes etching procedure. This wafer showed a deep red photoluminescence after being etched for three hours which mined to orange after another thirty minutes and finally to bright green after the final twenty minutes of etching.

From the above teaching relative to the importance of positionally defining the sites of lightguide pore nucleation to arrive at the ultimate nanostructure taught by this invention, it will be obvious to one skilled in semiconductor processing technology that methods other than controlling silicon dopant density may be used to effect the same result with the additional and perhaps crucially important factor of having the capability for defining specific rather than only an average number of nucleation sites.

Any method that produces structural damage to the silicon surface may be employed. Such methods would include ion implantation, in either scanned ion beam (to allow positional definition of damage sites) or an overall "dose" ion implantation which would effect the average distance between damage nucleation sites. Alternatively, scanned electron or laser beams might be used for the same purpose.

What is claimed is:

1. Optically interactive nanostructural element comprising: a semiconductor substrate including at least one radiation guide region extending into the substrate, the geometry of the substrate material surrounding the radiation guide region being selected such that it acts as a quantum confinement region for electrons in the substrate material and the radiation guide region acts as a classical waveguide for radiation, whereby the element absorbs or emits light of a wavelength corresponding to the selected geometry.

2. The optically interactive nanostructural element of claim 1 wherein the depth L and the lateral width d of the radiation guide region which determine the aspect ratio of an optical lightguide region is determined by $$\log_{10} (2L/\pi r) = (-0.46 \times V + 0.3) \times d/r + 0.85 \ V - 1.4 + \log \delta$$

where r is the radius of the quantum electron confining receptor encompassing the optical lightguide region, $\delta = 1 - (n_1/n_2)^2$ where $n_1$ is the refractive index of the substrate material and $n_2$ is the refractive index of the optical lightguide region, the quantity d−2r is the center-to-center distance between two adjacent quantum confined electron receptors, and $V = 2\pi r \ \delta/\lambda$ where $\lambda$ is the light wavelength.

3. The optically interactive nanostructural element of claim 1 wherein the substrate material is silicon.

4. The optically interactive nanostructural element of claim 1 wherein the at least one radiation guide region is filled with a material having an index of refraction differing from the index of refraction of the substrate material.

5. The optically interactive nanostructural element of claim 1 wherein geometric shaping of either the vertical dimensions of the electron quantum confinement receptors or their shape are used to effect broad banding of the optical absorption or emission.

6. The optically interactive nanostructural element of claim 1 wherein the structure further includes a junction semiconductor device to introduce electrons into the nanostructural element and cause light to be emitted.

7. The optically interactive nanostructural element of claim 1 wherein the structure further includes a junction semiconductor device where the nanostructural element is used to effect absorption of a specific optical spectrum to greater electrons.

8. Then nanostructural element of claim 1 wherein the radiation guide region has a circular cross-section.

9. The nanostructural element of claim 1 wherein the radiation guide region has a square cross-sectional configuration.

10. The nanostructural element of claim 1 wherein the radiation guide region varies in diameter along its depth to achieve geometrical optical broad banding.

11. Optically interactive nanostructural element comprising:
a semiconductor substrate including an array of radiation guide regions extending into the substrate, the geometry of the substrate material surrounding the radiation guide regions being selected such that it acts as a quantum confinement region for electrons in the substrate material and the radiation guide regions act as classical wave guide for radiation, the array including adjacent large and small effective area nanostructures wherein the ratio of the largest to the smallest size nanostructure elements determines the overall optical bandwith of the array surface.

12. The nanostructural element of claim 11 wherein the size ratio is approximately 1:1.75.

13. The nanostructural element of claim 11 wherein eight smaller areas are grouped around a larger area nanostructural element.

14. The nanostructural element of claim 11 wherein the size of the nanostructural elements varies across a surface whereby an optical nanodiffractometry function is achieved.

15. The nanostructural element of claim 11 wherein the array comprises a plurality of adjacent structures, each structure including a larger central portion surrounded by a plurality of smaller elements.

16. Method for making an optically interactive nanostructural element responsive to a preselected wavelength of light comprising:
anodically etching a substrate material while illuminating the substrate material with the preselected wavelength of light.

17. The method according to claim 16 wherein the substrate material includes dopants to provide nucleation sites.

* * * * *